United States Patent
McNeil et al.

(10) Patent No.: US 12,373,109 B2
(45) Date of Patent: Jul. 29, 2025

(54) VALIDATING READ LEVEL VOLTAGE IN MEMORY DEVICES

(71) Applicant: Micron Technology, Inc., Boise, ID (US)

(72) Inventors: Jeffrey S. McNeil, Nampa, ID (US); Eric N. Lee, San Jose, CA (US); Vamsi Pavan Rayaprolu, Santa Clara, CA (US); Sivagnanam Parthasarathy, Carlsbad, CA (US); Kishore Kumar Muchherla, San Jose, CA (US); Patrick R. Khayat, San Diego, CA (US); Violante Moschiano, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 247 days.

(21) Appl. No.: 17/979,534

(22) Filed: Nov. 2, 2022

(65) Prior Publication Data

US 2023/0176741 A1 Jun. 8, 2023

Related U.S. Application Data

(60) Provisional application No. 63/285,715, filed on Dec. 3, 2021.

(51) Int. Cl.
  *G06F 3/06* (2006.01)

(52) U.S. Cl.
  CPC ......... *G06F 3/0613* (2013.01); *G06F 3/0653* (2013.01); *G06F 3/0679* (2013.01)

(58) Field of Classification Search
  CPC ..... G06F 3/0613; G06F 3/0653; G06F 3/0679
  See application file for complete search history.

(56) References Cited

U.S. PATENT DOCUMENTS

2017/0116070 A1* 4/2017 Alrod ................ G11C 16/26
2020/0210259 A1* 7/2020 Hoei ................. G11C 16/3418

* cited by examiner

*Primary Examiner* — Baboucarr Faal
(74) *Attorney, Agent, or Firm* — Lowenstein Sandler LLP

(57) ABSTRACT

Described are systems and methods for validating read level voltage in memory devices. An example memory device comprises: a memory array comprising a plurality of memory cells electrically coupled to a plurality of wordlines; and a controller coupled to the memory array, the controller to perform operations comprising: causing a read level voltage to be applied to a specified wordline of the plurality of wordlines; receiving an actual bit count reflecting a number of memory cells that have their respective threshold voltages below the read level voltage; and responsive to determining that a difference of an expected bit count and the actual bit count exceeds a predetermined threshold value, adjusting the read level voltage.

20 Claims, 7 Drawing Sheets

VALIDATING READ LEVEL VOLTAGE IN MEMORY DEVICES

REFERENCE TO RELATED APPLICATION

This application claims the benefit of U.S. Provisional Patent Application No. 63/285,715, filed Dec. 3, 2021, the entirety of which is incorporated herein by reference.

TECHNICAL FIELD

Embodiments of the disclosure relate generally to memory sub-systems, and more specifically, to validating read level voltage in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
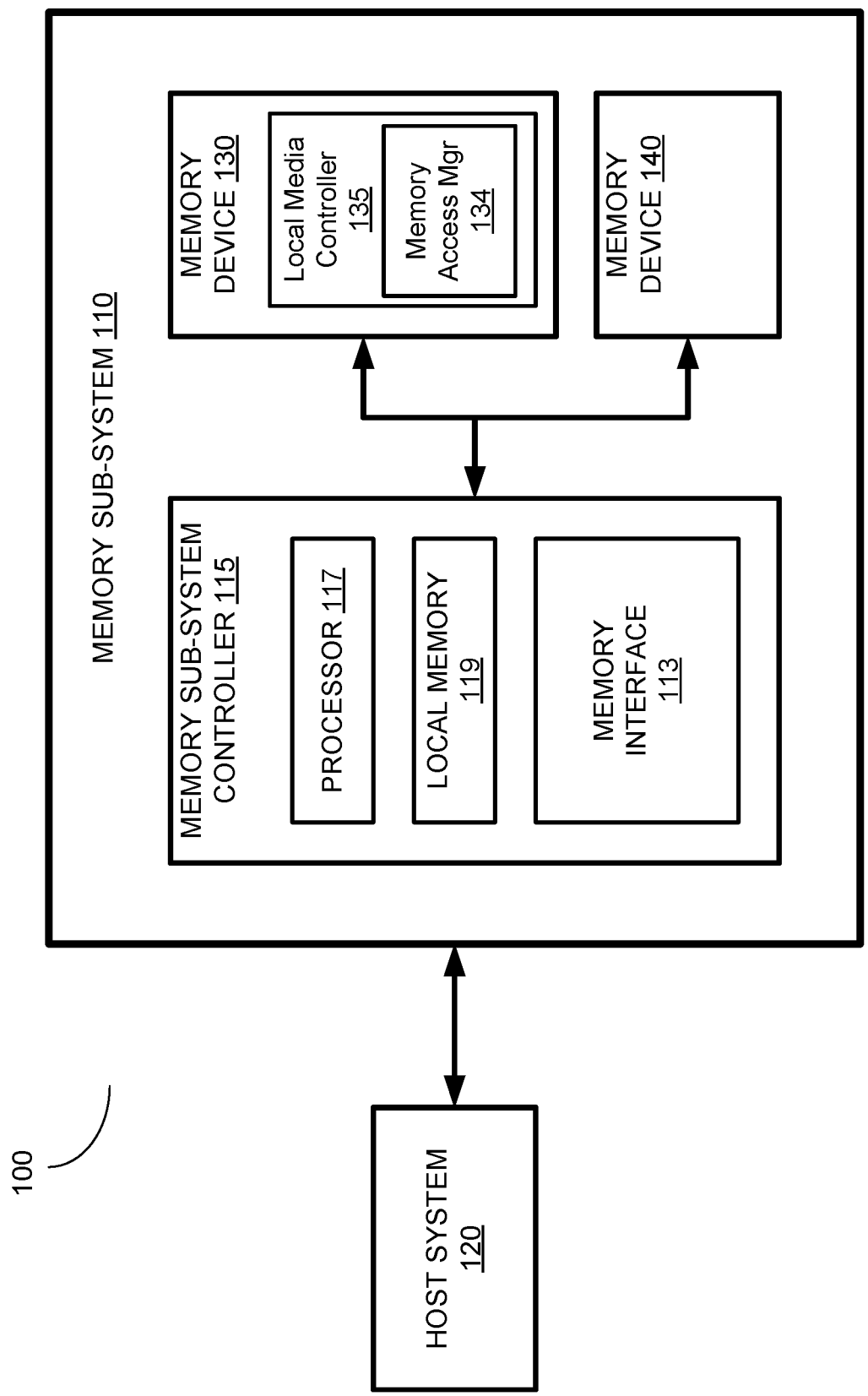
FIG. 1 illustrates an example computing system that includes a memory sub-system in accordance with some embodiments of the present disclosure.

Aspects of the present disclosure are directed to validating read level voltage in memory devices. One or more memory devices can be a part of a memory sub-system, which can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a Not-AND (NAND) memory device. Other examples of non-volatile memory devices are described below in conjunction with FIG. 1. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline is coupled to multiple memory cells forming a row of the matric of memory cells, while a bitline is coupled to multiple memory cells forming a column of the matric of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltage ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

A memory device typically experiences random workloads which can impact the threshold voltage distributions causing them to shift to higher or lower values. In order to compensate for various voltage distribution shifts, calibration operations can be performed in order to adjust the read levels based on values of one or more data state metrics obtained from a sequence of read and/or write operations. In some implementations, the data state metric can be represented by a raw bit error rate (RBER), which is the ratio of the number of erroneous bits to the number of all data bits stored in a certain portion of the memory device (e.g., in a specified data block). In some implementations, sweep reads can be performed in order to create RBER/log likelihood ratio (LLR) profiles to error correction coding (ECC) and select the most efficient profile. Alternatively, memory device-assisted read calibration techniques may be employed, such as auto read calibration, read retry, corrective read, etc.

However, these and other memory device-assisted calibration techniques usually exhibit high latencies, thus adversely affecting the overall latency of memory access operations. Furthermore, such techniques are effectively "blind" with respect to the voltage distribution, which means that the threshold voltage estimate produced by such calibration techniques could gradually drift into the wrong voltage distribution valley, thus making the read data uncorrectable.

Implementations of the present disclosure address the above-referenced and other deficiencies of various common techniques by utilizing memory device-originated bit count information for validating read voltage levels. The bit count information can reflect the number of bits having their respective threshold voltages below and/or above each read level that has been utilized in a read strobe. "Read strobe" herein refers to applying a read level voltage to a chosen wordline on order to identify the memory cells having their respective threshold voltages below and/or above the applied read level. Thus, a read operation may include one or more read strobes. A memory device operating in accordance with aspects of the present disclosure is capable of returning, in response to a read strobe, the number of memory cells having their respective threshold voltage values below and/or above the applied read level.

Assuming that the stored data is randomly but uniformly distributed across voltage distributions, the bit count information can be utilized to ensure that the read level corresponds to the correct voltage distribution valley. In an illustrative example, if the read level utilized for a single level cell (SLC) memory page matches the voltage distribution valley margin separating the two threshold voltage distributions (corresponding to the memory cells storing "1" and "0" bit values), then about 50% of all memory cells of the memory page are expected to have their respective threshold voltage values be found below the applied read level. In this scenario, if the bit count returned by the memory device in response to a read strobe performed with respect to a memory page indicates that 70% of all memory cells of the memory page are found to the left of the read level, the read level should be shifted to the left. Similar techniques can be utilized for memory pages storing two or more bits per cell.

Thus, upon performing a read strobe, a bit count is returned by the memory devices to the memory sub-system controller or used by the local media controller in order to determine whether the read operation utilizes the read level corresponding to the correct voltage distribution valley. Such determination may involve comparing the actual bit count to the expected bit count, which corresponds to the expected position of the read level with respect to the threshold voltage distributions. Should a significant mismatch between the actual and the expected bit count be detected, the read level can be adjusted in order to compensate for the voltage distribution shift that presumably has caused the actual bit count to deviate from the expected bit count. The sign of the read level adjustment can match the sign of the difference between the expected and the actual bit count: if the actual count of bits having their respective threshold voltages below the applied read level exceeds the expected bit count, the read level should be decreased (i.e., shifted to the left), and vice versa. The adjusted read level can then be utilized for performing subsequent read operations with respect to the wordline to which the initial read strobe has been applied and/or to one or more neighboring wordlines of that wordline.

In some implementations, the expected bit count information can be stored in a reserved area of the memory devices (e.g., in the flag byte) and during a read operation can be compared, by the local media controller, to the actual distribution count in order to identify possible significant deviations, as described in more detail herein below.

Thus, advantages of this approach include, but are not limited to, improving the efficiency of memory access operations by correcting a possible significant misalignment of the read levels and actual voltage distribution valleys. Such correction can require minimal bandwidth of the memory bus (e.g., the ONFI bus): instead of transmitting contents of an entire memory page, only the bit counts would be transmitted by the memory device to the memory controller for detecting a possible misalignment of the read levels and actual voltage distribution valleys. Furthermore, since the methods described herein cause minimal performance overhead, these methods can be built into existing read algorithms without adversely affecting the memory access latency.

While the examples described herein involve single level cell (SLC) and multiple level cell (MLC) voltage distributions, in various other implementations, similar techniques can be implemented for memory pages storing three or more bits per cell.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a memory access manager 134 configured to carry out memory access operations, e.g., in response to receiving memory access commands from memory interface 113. In some embodiments, local media controller 135 includes at least a portion of memory access manager 134 and is configured to perform the functionality described herein. In some embodiments, memory access manager 134 is implemented on memory device 130 using firmware, hardware components, or a combination of the above. In an illustrative example, memory access manager 134 receives, from a requestor, such as memory interface 113, a request to read a data page of the memory device 130. A read operation can include a series of read strobes, such that each strobe applied a certain read level voltage to a chosen wordline of a memory device 130 in order to compare the estimated threshold voltages $V_T$ of a set of memory cells to one or more read levels corresponding to the expected positions of the voltage distributions of the memory cells.

In some embodiments, memory access manager 134 utilizes bit count information maintained by the memory devices 130 for verifying whether the read level utilized for a read strobe corresponds to the correct voltage valley. The bit count information can reflect the number of bits having their respective threshold voltages below and/or above each read level that has been utilized in the read strobe.

When a read strobe is applied to a memory device 130, the memory device returns to the controller (which can be represented, e.g., by the memory sub-system controller 130 or the local media controller 135), a bit count reflecting the number of bits having their respective threshold voltages below and/or above the read level that has been utilized in the read strobe. The controller can then compare the actual bit count to the expected bit count, which corresponds to the expected position of the read level with respect to the threshold voltage distributions.

Should a significant mismatch between the actual and the expected bit count be detected, the read level can be adjusted in order to compensate for the voltage distribution shift that presumably has caused the actual bit count to deviate from the expected bit count. The sign of the read level adjustment can match the sign of the difference between the expected and the actual bit count: if the actual count of bits having their respective threshold voltages below the applied read level exceeds the expected bit count, the read level should be decreased (i.e., shifted to the left), and vice versa.

The read level can be adjusted by performing a calibration operation. In some implementations, the absolute value of the read level adjustment can be proportional to the absolute value of the difference between the actual and the expected bit count. The adjusted read level can then be utilized for performing subsequent read operations with respect to the wordline to which the initial read strobe has been applied and/or to one or more neighboring wordlines of that wordline.

In some implementations, the expected bit count information can be stored in a reserved area of the memory device 130 (e.g., in the flag byte associated with a memory page) and during a read operation can be compared, by the local media controller, to the actual distribution count in order to identify possible significant deviations, as described in more detail herein below.

Figure 2:
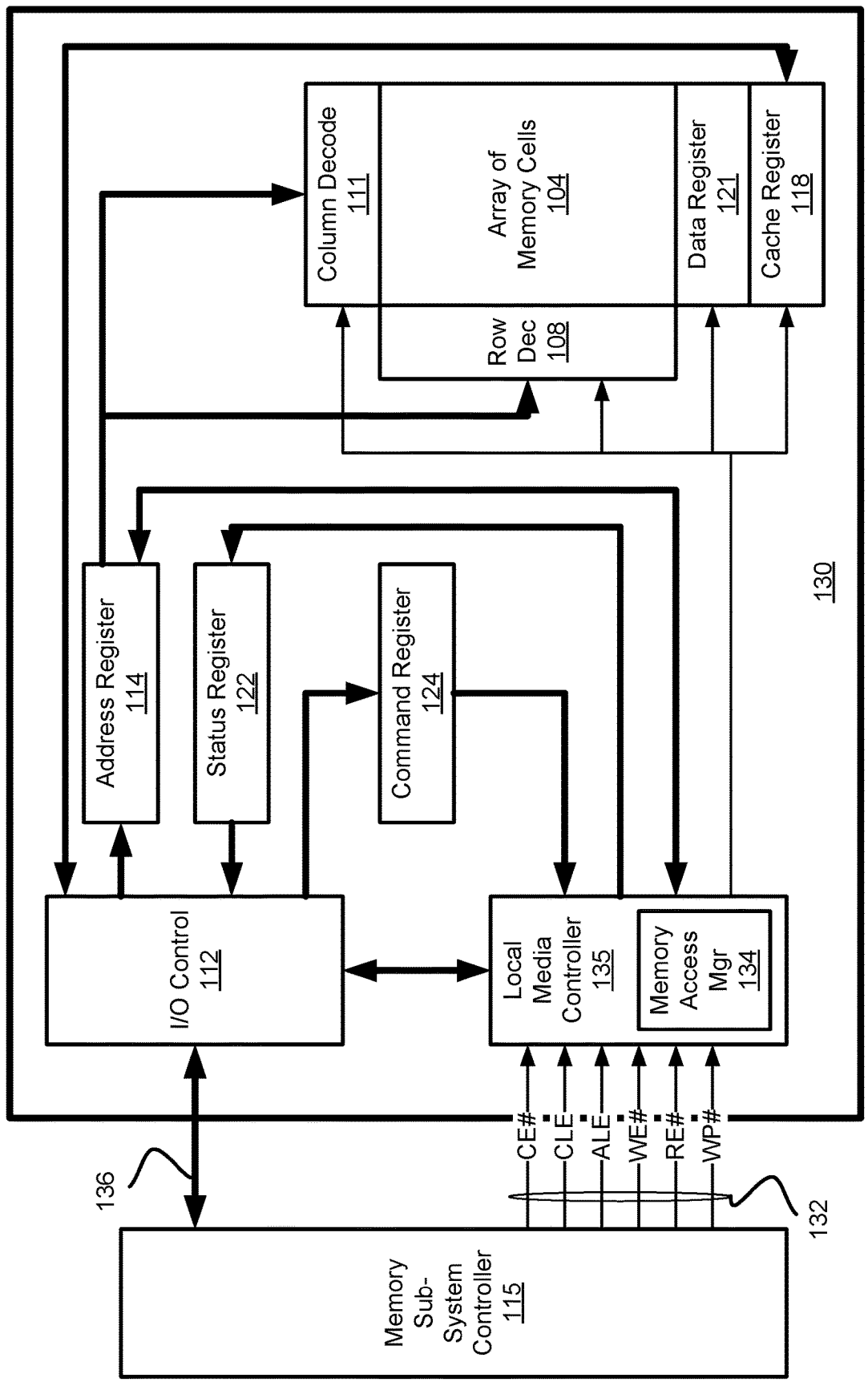
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 104 are capable of being programmed to one of at least two target data states.

Row decode circuitry 108 and column decode circuitry 111 are provided to decode address signals. Address signals are received and decoded to access the array of memory cells 204. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 108 and column decode circuitry 111 to control the row decode circuitry 108 and column decode circuitry 111 in response to the addresses. In one embodiment, local media controller 135 includes memory access manager 134, which can implement the memory programming operations with respect to memory device 130, as described herein.

The local media controller 135 is also in communication with a cache register 218. Cache register 118 latches data, either incoming or outgoing, as directed by the local media controller 135 to temporarily store data while the array of memory cells 104 is busy writing or reading, respectively, other data. During a programming operation (e.g., a write operation), data may be passed from the cache register 118 to the data register 121 for transfer to the array of memory cells 204; then new data may be latched in the cache register 118 from the I/O control circuitry 112. During a read operation, data may be passed from the cache register 118 to the I/O control circuitry 112 for output to the memory sub-system controller 115; then new data may be passed from the data register 121 to the cache register 118. The cache register 118 and/or the data register 121 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE#, a command latch enable signal CLE, an address latch enable signal ALE, a write enable signal WE#, a read enable signal RE#, and a write protect signal WP#. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 112 and may then be written into command register 224. The addresses may be received over input/output (I/O) pins [7:0] of I/O bus 136 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 121 for programming the array of memory cells 104.

In an embodiment, cache register 118 may be omitted, and the data may be written directly into data register 121. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

In some implementations, additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

One or more memory devices of the memory sub-system 100 can be represented, e.g., by NAND memory devices that utilize transistor arrays built on semiconductor chips. As illustrated schematically in FIG. 3A, a memory cell of a memory device can be a transistor, such as metal-oxide-semiconductor field effect transistor (MOSFET), having a source (S) electrode and a drain (D) electrode to pass electric current there through. The source and drain electrodes can be connected to a conductive bitline (BL), which can be shared by multiple memory cells. A memory device can include an array or memory cells that are connected to a plurality of wordlines (WL) and a plurality of bitlines (BL), as schematically illustrated by FIG. 4. A memory device can further include circuitry for selectively coupling WLs and BLs to voltage sources providing control gate and source-drain signals, which is omitted from FIG. 4 for clarity and conciseness.

Figure 3B:
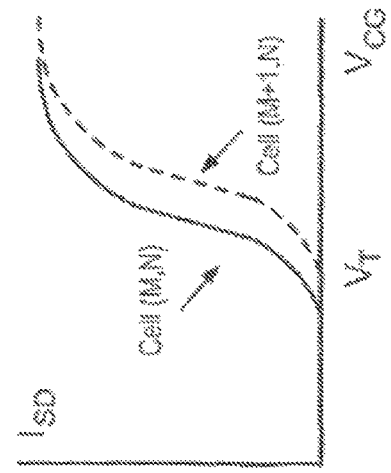
FIG. 3B schematically illustrates schematically dependence of the source-drain current on the control gate voltage for two memory cells.

Referring again to FIG. 3A, memory cells 302 and 304 can be connected to the same bitline N and two different conductive wordlines, M and M+1, respectively. A memory cell can further have a control gate (CG) electrode to receive a voltage signal $V_{CG}$ to control the magnitude of electric current flowing between the source electrode and the drain electrode. More specifically, there can be a threshold control gate voltage $V_T$ (herein also referred to as "threshold voltage" or simply as "threshold") such that for $V_{CG} < V_T$, the source-drain electric current can be low, but can increase substantially once the control gate voltage has exceeded the threshold voltage, $V_{CG} > V_T$. Transistors of the same memory device can be characterized by a distribution of their threshold voltages, $P(V_T) = dW/dV_T$, so that $dW = P(V_T)dV_T$ represents the probability that any given transistor has its threshold voltage within the interval $[V_T, V_T + dV_T]$. For example, FIG. 3B illustrates schematically dependence of the source-drain current $I_{SD}$ on the control gate voltage for two memory cells, e.g. memory cell 302 (solid line) and memory cell 304 (dashed line), having different threshold control gate voltages.

Figure 3A:
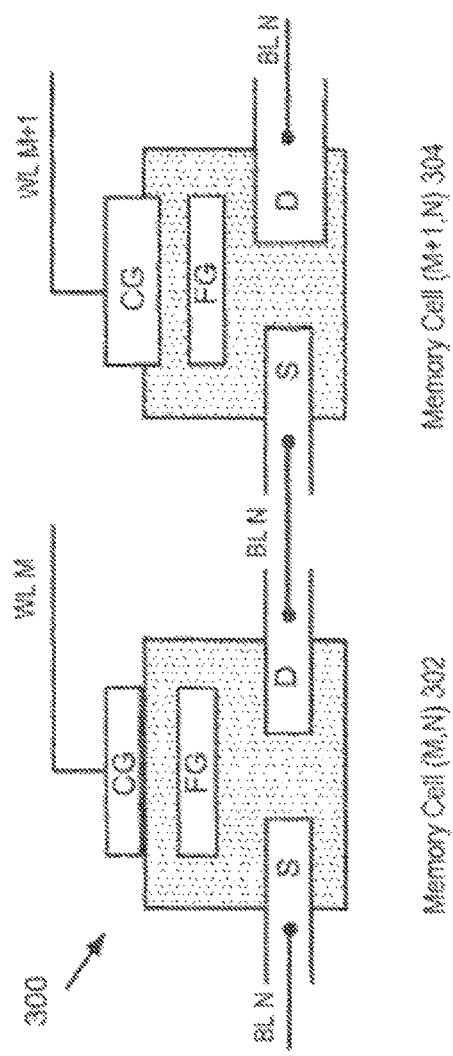
FIG. 3A schematically illustrates a set of memory cells as arranged in a memory device.
Figure 4:
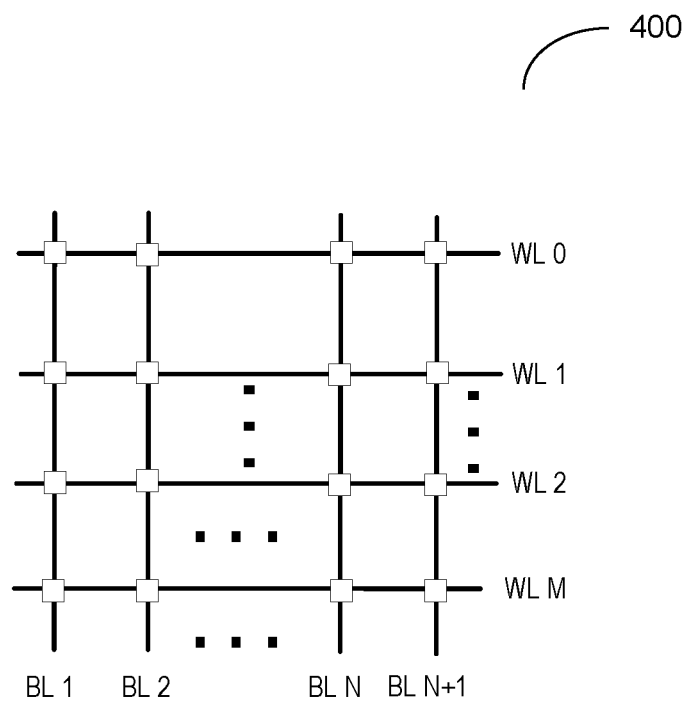
FIG. 4 schematically illustrates an example memory array.

To make a memory cell non-volatile, the cell can be further equipped with a conducting island—a charge storage node—that can be electrically isolated from the control gate, the source electrode, and the drain electrode by insulating layers (depicted in FIG. 3A as the dotted region). In response to an appropriately chosen positive (in relation to the source potential) control gate voltage $V_{CG}$, the charge storage node can receive an electric charge Q, which can be permanently stored thereon even after the power to the memory cell—and, consequently, the source-drain current—is ceased. The charge Q can affect the distribution of threshold voltages $P(V_T, Q)$. Generally, the presence of the electric charge Q shifts the distribution of threshold voltages towards higher voltages, compared with the distribution $P(V_T)$ for an uncharged charge storage node. This happens because a stronger positive control gate voltage $V_{CG}$ can be needed to overcome a negative potential of the charge storage node charge Q. If any charge of a sequence $Q_k$ of charges with $1 \le k \le 2^N$ can be selectively programmed (and later detected during a read operation) into a memory cell, the memory cell can function as an N-bit storage unit. The charges $Q_k$ are preferably selected to be sufficiently different from each other, so that any two adjacent voltage distributions $P(V_T, Q_k)$ and $P(V_T, Q_{k+1})$ do not overlap being separated by a valley margin, so that $2^N$ distributions $P(V_T, Q_k)$ are interspaced with $2^N - 1$ valley margins.

Figure 3C:
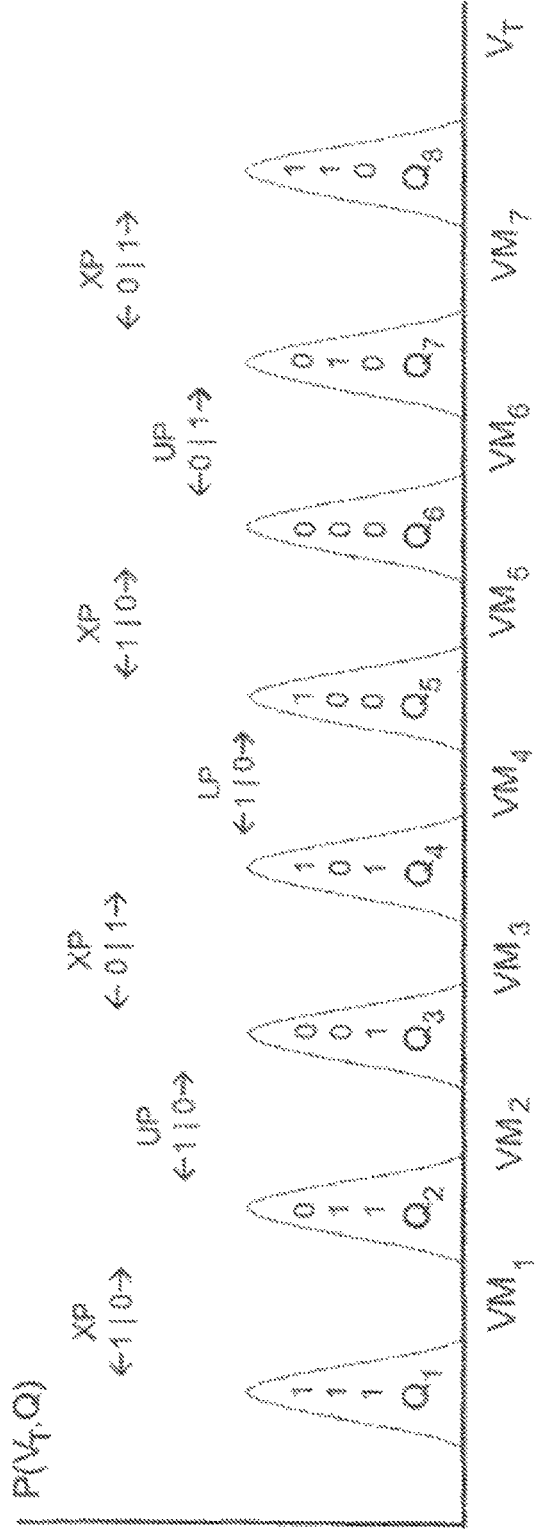
FIG. 3C schematically illustrates an example distribution of threshold control gate voltages for a set of memory cells.

FIG. 3C illustrates schematically a distribution of threshold control gate voltages for a set of memory cells capable of storing three bits of data by programming the memory cell into at least eight charge states that differ by the amount of charge on the cell's charge storage node. FIG. 3C shows distributions of threshold voltages $P(V_T, Q_k)$ for $2^N = 8$ different charge states of a tri-level cell (TLC) separated with $2^3 - 1 = 7$ valley margins $VM_k$. Accordingly, a memory cell programmed into a charge state k-th (i.e., having the charge $Q_k$ deposited on its charge storage node) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

Memory devices can be classified by the number of bits stored by each cell of the memory. For example, a single-level cell (SLC) memory has cells that can each store one bit of data (N=1). A multi-level cell (MLC) memory has cells that can each store up to two bits of data (N=2), a tri-level cell (TLC) memory has cells that can each store up to three bits of data (N=3), and a quad-level cell (QLC) memory has cells that can each store up to four bits of data (N=4). In general, the operations described herein can be applied to memory devices having N-bit memory cells, where N>1.

For example, a TLC can be capable of being in one of eight charging states $Q_k$ (where the first state is an uncharged state $Q_1 = 0$) whose threshold voltage distributions are separated by valley margins $VM_k$ that can be used to read out the data stored in the memory cells. For example, if it is determined during a read operation that a read threshold voltage falls within a particular valley margin of $2^N - 1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory controller 215.

As noted herein above, the memory controller 215 can program a state of the memory cell and then read can read this state by comparing a read threshold voltage $V_T$ of the memory cell against one or more read level thresholds. The read operation can be performed after a memory cell is placed in one of its charged states by a previous programming operation, which can include one or more programming passes. Each programming pass would apply appropriate programming voltages to a given wordline in order place appropriate charges on the charge storage nodes of the memory cells that are connected to the wordline.

A programming operation involves a sequence of programming voltage pulses that are applied to a selected (target) wordline (i.e., the wordline that is electrically coupled to the target memory cells). Referring again to FIG. 3A, the source (S) and drain (D) electrodes of a memory cell can be connected to a conductive bitline shared by multiple memory cells. A programming operation would apply a sequence of programming voltage pulses to the control gate (CG) via a corresponding wordline (WL). Each programming voltage pulse would induce an electric field that would pull the electrons onto the charge storage node. After each programming pulse is applied to the selected wordline, a verify operation can be performed by reading the memory cell in order to determine whether the threshold voltage $V_T$ of the memory cell has reached a desired value (voltage verify level). If the threshold voltage $V_T$ of the memory cell has reached the verify voltage associated with the desired state, the bitline to which the memory cell is connected can be biased at the program inhibit voltage, thus inhibiting the memory cells that are coupled to the bitline from being further programmed, i.e., to prevent the threshold voltate $V_T$ of the memory cells from shifting further upward in response to subsequent programming pulses applied to the selected wordline.

Figure 5:
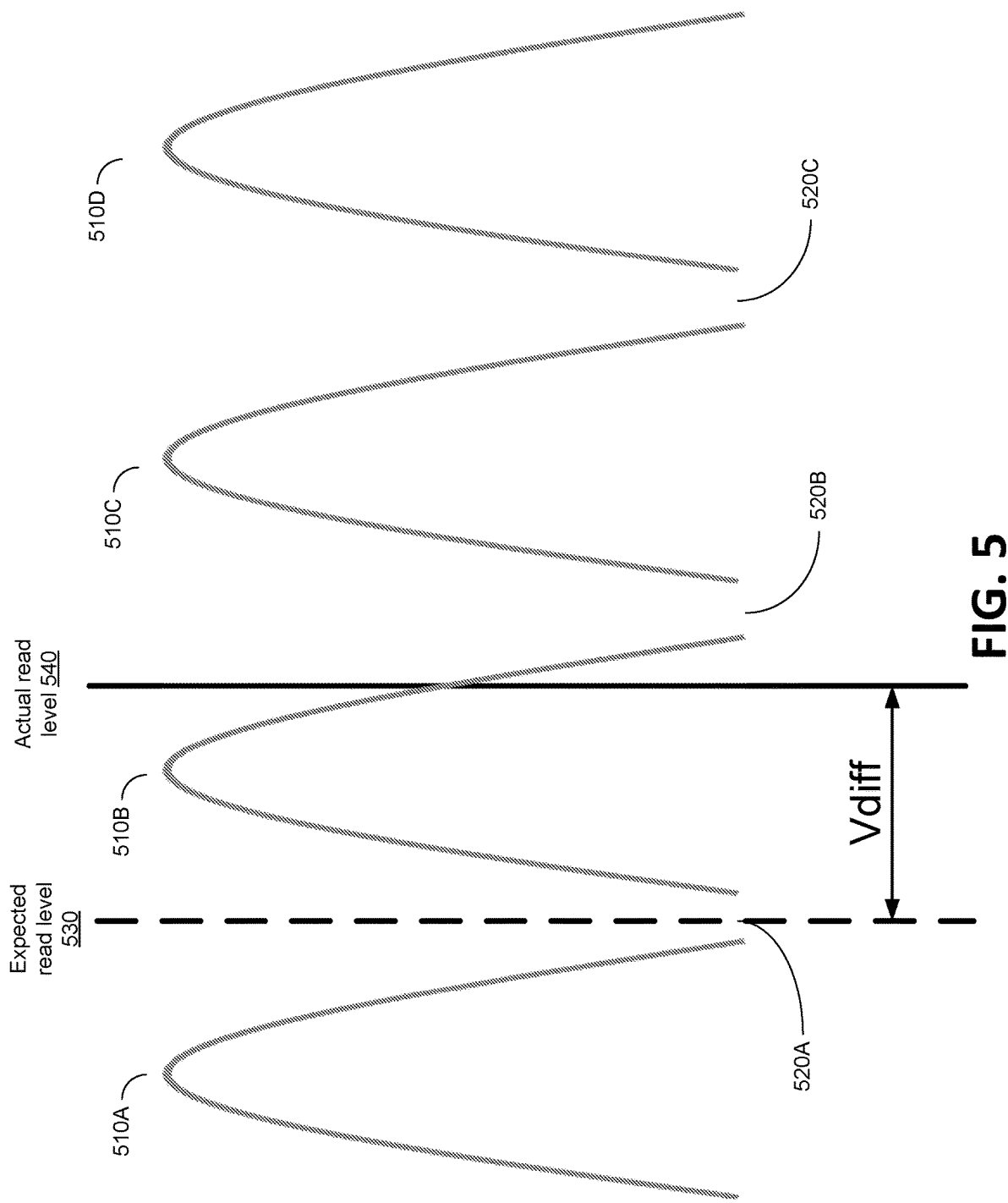
FIG. 5 schematically illustrates example threshold voltage distributions in a multi-level cell (MLC) memory page, in accordance with aspects of the present disclosure.

FIG. 5 schematically illustrates example threshold voltage distributions in a MLC memory page, in accordance with aspects of the present disclosure. Each memory cell can be programmed into four charge states that differ by the amount of charge stored by the cell. FIG. 5 shows example distributions 510A-510D of threshold voltages $P(V_T, Q_k)$ for different MLC charge states, which are separated by valley margins 520A-520C. The charge state $Q_k$ of a given memory cell can be determined by a read operation by detecting that a control gate voltage $V_{CG}$ within the valley margin $VM_k$ is sufficient to open the cell to the source-drain current whereas a control gate voltage within the preceding valley margin $VM_{k-1}$ is not. Accordingly, for a given read operation, the memory sub-system controller 115 can sequentially perform two or more read strobes at the read voltage levels that correspond to the presumed positions of one or more valley margins 520A-520C.

In some implementations, in response to a read strobe issued by the memory sub-system controller 115, the memory device may return the bit count indicating the number of bits below and/or above the read level of the read strobe. The memory sub-system controller 115 can then compare the actual bit count to the expected bit count, which corresponds to the expected position of the read level with respect to the voltage distributions of the memory page.

In the illustrative example of FIG. 5, if the current read level 530 matches the leftmost voltage distribution valley margin 520A, then about 25% of all memory cells are expected be found to the left of the read level, since the expected left bit count can be defined by the position of the read level with respect to the valley margins:

$$LB = TB * k / 2^N,$$

where LB is the left bit count (i.e., the number of bits of a given memory page that have their respective threshold voltages below the applied read level), TB is the total bit count (i.e., the total number of bits per page), k is the sequential number of the margin valley corresponding to the applied read level, and N is the number of bits per cell.

Since the number of bits per cell is known for a given memory page, a count of memory cells can be used instead of the bit count.

In the illustrative example of FIG. 5, the bit count returned by the memory device in response to the read operation indicates that approximately 45% of all memory cells are found to the left of the read level, thus placing the current read level to the actual position 540. This bit count can be interpreted as indicating that the voltage distributions 500 have shifted to the left by the value of $V_{diff}$ that reflects the difference of the left bit counts for the actual 540 and expected 530 read levels.

Accordingly, responsive to determining that the difference between the actual and expected bit counts exceeds a predetermined threshold value, the memory sub-system controller 115 can adjust the read voltage accordingly, in order to compensate for the voltage distribution shift that presumably has caused the actual bit count to deviate from the expected bit count. The sign of the read level adjustment can match the sign of the difference between the expected and the actual bit count: if the actual count of bits found to the left of the read level exceeds the expected bit count, the read level should be decreased, and vice versa. In some implementations, the absolute value of read voltage adjustment can reflect the absolute value of the difference between the actual and the expected bit count. In the illustrative example of FIG. 5, the memory sub-system controller can decrease the read level by the value of $V_{diff}$ before repeating the read operation. In an illustrative example the voltage adjustment $V_{diff}$ can be proportional to the difference of the actual and expected bit counts.

The adjusted read level can then be utilized for performing subsequent read operations with respect to the wordline to which the initial read strobe has been applied and/or to one or more neighboring wordlines of that wordline.

In some implementations, the expected bit count information can be stored in a reserved area of the memory devices 130 (e.g., in the flag byte, which is a reserved area associated with a memory page). During a read operation, the local media controller can compare the stored expected bit count to the actual bit count in order to identify possible significant deviations.

Should the difference between the actual and expected bit counts fall below the predetermined threshold value, the memory sub-system controller 115 can continue with the read operation, e.g., issue the next read strobe to the memory device 130.

While the illustrative example of FIG. 5 operates with an MLC page, similar techniques can be utilized for memory pages storing any number of bits per cell, e.g., three or more bits per cell.

Figure 6:
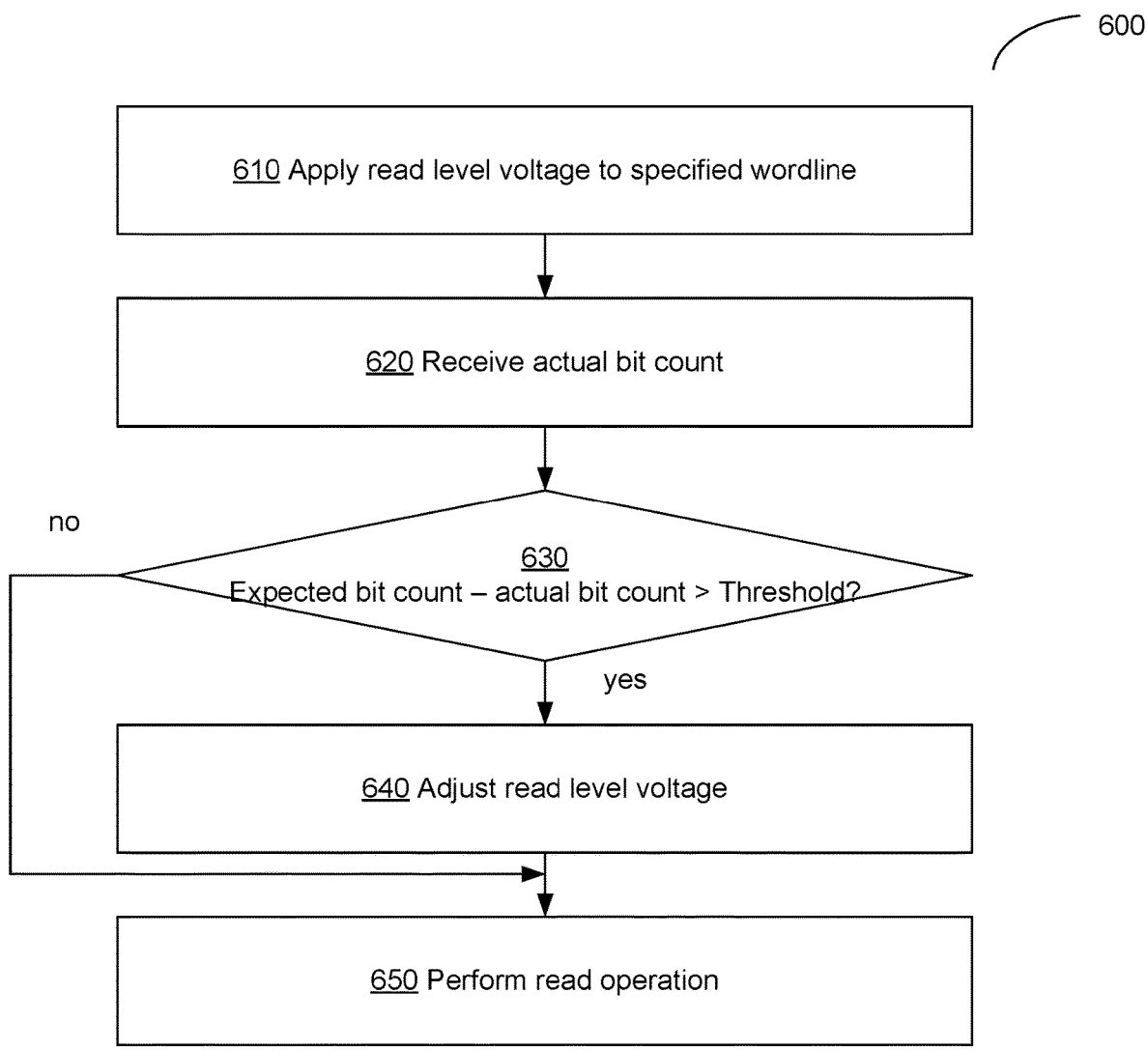
FIG. 6 is a flow diagram of an example method of validating read level voltage in memory devices, in accordance with embodiments of the present disclosure.

FIG. 6 is a flow diagram of an example method of validating read level voltage in memory devices, in accordance with embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the memory sub-system controller 115 and/or the local media controller 135 of FIG. 1. Although shown in a particular sequence or order, unless otherwise specified, the order of the operations can be modified. Thus, the illustrated embodiments should be understood only as examples, and the illustrated operations can be performed in a different order, and some operations can be performed in parallel. Additionally, one or more operations can be omitted in various embodiments. Thus, not all operations are required in every embodiment.

At operation 610, the controller implementing the method causes a chosen read level voltage to be applied to a specified wordline of a memory device.

At operation 620, the controller receives, via the memory interface, an actual bit count reflecting the number of memory cells that have their respective threshold voltages below the applied read level voltage. In various implementations, the bit count can be equal to the number of memory cells that have their respective threshold voltages below the applied read level voltage or the number of memory cells that have their respective threshold voltages above the applied read level voltage. In some implementations, the bit count can be represented by the number of memory cells, as described in more detail herein above.

Responsive to determining, at operation 630, that the difference of the expected bit count and the actual bit count exceeds a predetermined threshold value, the controller, at operation 640 adjusts the read level voltage. Adjusting the read level voltage may involve performing a calibration operation with respect to the set of memory cells (e.g., a memory page) addressable by one or more adjacent wordlines including the specified wordline.

The expected bit count can reflect an expected position of the read level with respect to threshold voltage distributions of the set of memory cells addressable by one or more adjacent wordlines including the specified wordline. In some implementations, the expected bit count is stored in a metadata area of the set of memory cells addressable by one or more adjacent wordlines including the specified wordline.

The calibration operation can involve performing several read strobes at varying read levels and computing respective values of a chosen data state metric (e.g., RBER) in order to identify the read level that minimizes the value of the chosen data state metric. In some implementations, the read level voltage can be adjusted by applying, to the read level voltage, a read level adjustment that reflects the difference of the expected bit count and the actual bit count, as described in more detail herein above.

At operation 650, the controller performs a read operation, using the adjusted read level voltage, with respect to one or more adjacent wordlines including the specified wordline.

Figure 7:
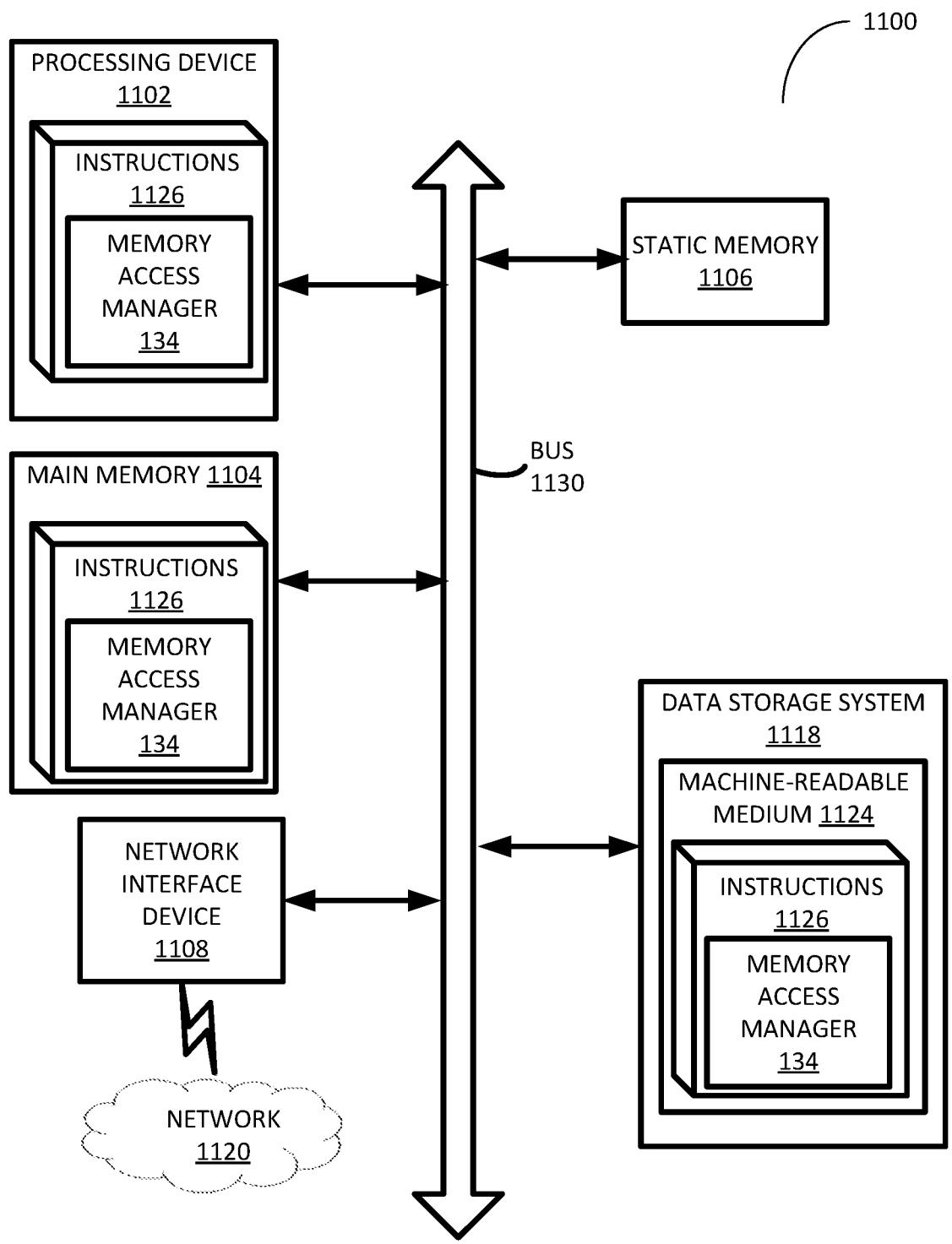
FIG. 7 is a block diagram of an example computer system in which embodiments of the present disclosure can operate.

FIG. 7 illustrates an example machine of a computer system 1100 within which a set of instructions, for causing the machine to perform any one or more of the methods discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to memory access manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methods discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1114 (also known as a computer-readable medium, such as a non-transitory computer-readable medium) on which is stored one or more sets of instructions 1126 or software embodying any one or more of the methods or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to memory access manager 134 of FIG. 1). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methods of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device, comprising:
    a memory array comprising a plurality of memory cells electrically coupled to a plurality of wordlines; and
    a controller coupled to the memory array, the controller to perform operations comprising:
        causing a read level voltage to be applied to a specified wordline of the plurality of wordlines;
        receiving an actual bit count reflecting a number of memory cells that have their respective threshold voltages below the read level voltage;
        determining an expected bit count as proportional to a sequential number of a margin valley corresponding to the read level voltage; and
        adjusting the read level voltage by applying, to the read level voltage, a read level adjustment that is proportional to a difference of the expected bit count and the actual bit count.

2. The memory device of claim 1, wherein adjusting the read level voltage further comprises:
    causing a calibration operation to be performed with respect to a set of memory cells addressable by one or more adjacent wordlines comprising the specified wordline.

3. The memory device of claim 1, wherein the expected bit count reflects an expected position of the read level with respect to threshold voltage distributions of a set of memory cells addressable by one or more adjacent wordlines comprising the specified wordline.

4. The memory device of claim 1, wherein the expected bit count is stored in a metadata area of a set of memory cells addressable by one or more adjacent wordlines comprising the specified wordline.

5. The memory device of claim 1, wherein the operations further comprise:
    determining an adjusted read level voltage by performing a calibration operation with respect to a set of memory cells addressable one or more adjacent wordlines comprising the specified wordline; and
    causing a read operation to be performed by applying the adjusted read level voltage to one or more adjacent wordlines comprising the specified wordline.

6. The memory device of claim 1, wherein the controller is represented by one of: a memory sub-system controller or a local media controller.

7. A computer-readable non-transitory storage medium comprising executable instructions that, when executed by a controller managing a memory array comprising a plurality of memory cells electrically coupled to a plurality of wordlines, cause the controller to perform operations, comprising:
    causing a read level voltage to be applied to a specified wordline of the plurality of wordlines;
    receiving an actual bit count reflecting a number of memory cells that have their respective threshold voltages below the read level voltage;
    determining an expected bit count as proportional to a sequential number of a margin valley corresponding to the read level voltage; and
    adjusting the read level voltage by applying, to the read level voltage, a read level adjustment that is proportional to a difference of the expected bit count and the actual bit count.

8. The computer-readable non-transitory storage medium of claim 7, wherein adjusting the read level voltage is performed responsive to determining that the difference of the expected bit count and the actual bit count exceeds a predetermined threshold value.

9. The computer-readable non-transitory storage medium of claim 7, wherein the expected bit count reflects an expected position of the read level with respect to threshold voltage distributions of a set of memory cells addressable by one or more adjacent wordlines comprising the specified wordline.

10. The computer-readable non-transitory storage medium of claim 7, wherein the expected bit count is stored in a metadata area of a set of memory cells addressable by one or more adjacent wordlines comprising the specified wordline.

11. A method, comprising:
    causing, by a controller managing a memory array comprising a plurality of memory cells electrically coupled to a plurality of wordlines, a read level voltage to be applied to a specified wordline of the plurality of wordlines;
    receiving an actual bit count reflecting a number of memory cells that have their respective threshold voltages below the read level voltage;
    determining an expected bit count as proportional to a sequential number of a margin valley corresponding to the read level voltage; and
    adjusting the read level voltage by applying, to the read level voltage, a read level adjustment that is proportional to a difference of the expected bit count and the actual bit count.

12. The method of claim 11, wherein adjusting the read level voltage further comprises:
    causing a calibration operation to be performed with respect to a set of memory cells addressable by one or more adjacent wordlines comprising the specified wordline.

13. The method of claim 11, wherein the expected bit count reflects an expected position of the read level with respect to threshold voltage distributions of a set of memory cells addressable by one or more adjacent wordlines comprising the specified wordline.

14. The method of claim 11, wherein the expected bit count is stored in a metadata area of a set of memory cells addressable by one or more adjacent wordlines comprising the specified wordline.

15. The method of claim 11, further comprising:
    determining an adjusted read level voltage by performing a calibration operation with respect to a set of memory cells addressable by one or more adjacent wordlines comprising the specified wordline; and
    causing a read operation to be performed by applying the adjusted read level voltage to one or more adjacent wordlines comprising the specified wordline.

16. The memory device of claim 1, wherein a sign of the read level adjustment matches a sign of the difference of the expected bit count and the actual bit count.

17. The memory device of claim 1, wherein the expected bit count is proportional to a ratio of the sequential number of the margin valley corresponding to the read level voltage to 2 raised to the power of a number of bits-per-cell.

18. The memory device of claim 1, wherein the expected bit count is a product of a total number of bits per page and the sequential number of the margin valley corresponding to the read level voltage divided by 2 raised to the power of a number of bits-per-cell.

19. The memory device of claim 1, wherein adjusting the read level voltage is performed by decreasing the read level voltage responsive to determining that the actual bit count exceeds the expected bit count.

20. The memory device of claim 1, wherein adjusting the read level voltage is performed by increasing the read level voltage responsive to determining that the expected bit count exceeds the actual bit count.

* * * * *